(12) United States Patent
Lu et al.

(10) Patent No.: US 8,258,879 B2
(45) Date of Patent: Sep. 4, 2012

(54) CAPACITOR COUPLED QUADRATURE VOLTAGE CONTROLLED OSCILLATOR

(75) Inventors: Ying-Ta Lu, Fanlu Township (TW);
Ho-Hsiang Chen, Hsinchu (TW);
Chewn-Pu Jou, Hsinchu (TW);
Fu-Lung Hsueh, Cranbury, NJ (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 25 days.

(21) Appl. No.: 12/907,294

(22) Filed: Oct. 19, 2010

(65) Prior Publication Data

US 2012/0092077 A1 Apr. 19, 2012

(51) Int. Cl.
*H03L 7/00* (2006.01)

(52) U.S. Cl. .................. 331/2; 331/46; 331/50

(58) Field of Classification Search .............. 331/46, 331/2, 50
See application file for complete search history.

(56) References Cited

U.S. PATENT DOCUMENTS

| | | | |
|---|---|---|---|
| 6,850,122 B2 * | 2/2005 | Ravi et al. | 331/46 |
| 6,911,870 B2 | 6/2005 | Gierkink et al. | |
| 2009/0231047 A1 | 9/2009 | Jang et al. | |

* cited by examiner

*Primary Examiner* — Arnold Kinkead
(74) *Attorney, Agent, or Firm* — Lowe Hauptman Ham & Berner, LLP

(57) ABSTRACT

A quadrature oscillator includes a first oscillator having a first second-order harmonic node, a second oscillator having a second second-order harmonic node, and at least one capacitor coupling the first second-order harmonic node and the second second-order harmonic node. The first oscillator is configured to supply an in-phase signal and the second oscillator is configured to supply a quadrature signal.

21 Claims, 7 Drawing Sheets

US 8,258,879 B2

CAPACITOR COUPLED QUADRATURE VOLTAGE CONTROLLED OSCILLATOR

TECHNICAL FIELD

The present disclosure relates generally to an integrated circuit, and more particularly, to a voltage-controlled oscillator.

BACKGROUND

A quadrature local oscillator (LO) signal is an essential element in the direct conversion and low intermediate frequency (IF) transceivers for wireless communication technology, e.g., a Quadrature Amplitude Modulation (QAM) system. QAM is a modulation scheme for communication signals. It conveys two signals, an in-phase signal (I), and a quadrature signal (Q), with amplitude modulation of the two carrier waves. These two carrier waves for I and Q are out of phase with each other by 90°.

The quadrature signals (I and Q) can be generated by different methods. One conventional differential oscillator utilizing a divide-by-2 circuit that works at twice the desired frequency, has poor quadrature accuracy, and may have large power consumption. Another differential oscillator utilizing a poly-phase filter is subject to process variations, and a buffer amplifier is needed to compensate for the loss of the poly-phase filter.

For quadrature oscillators coupling two differential oscillators using active devices, e.g., transistors, such conventional quadrature oscillators have phase noise degradation due to added noise sources, extra power consumption, less voltage headroom, and/or LC resonant frequency effects. Also, conventional coupling between two differential oscillators using transformers, incurs large chip area consumption.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
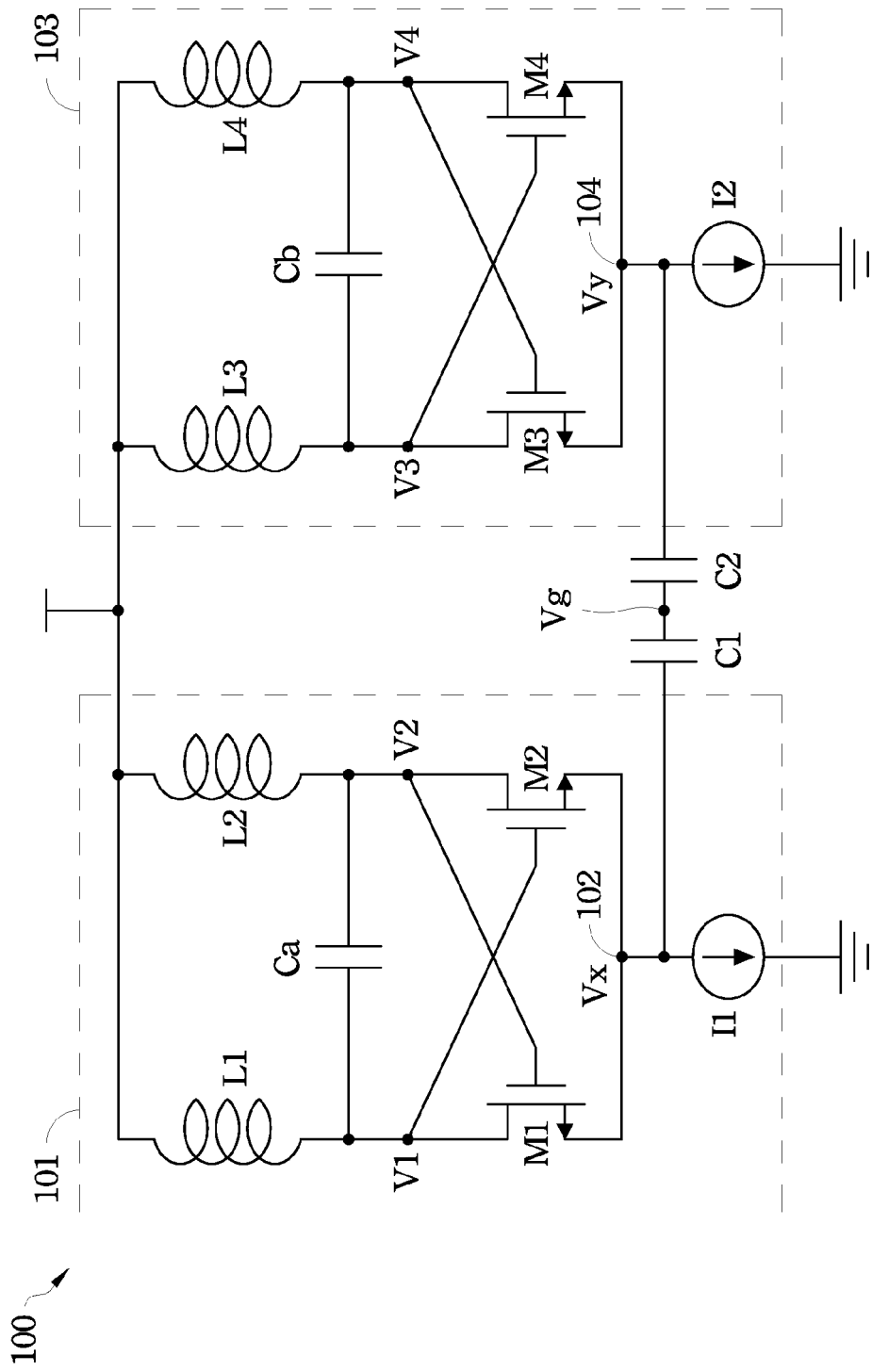
FIG. 1 is a schematic diagram showing an exemplary quadrature oscillator according to one embodiment.

FIG. 1 is a schematic diagram showing an exemplary quadrature oscillator 100 according to one embodiment. The quadrature oscillator 100 is implemented with two differential voltage controlled oscillator (VCO) circuits 101 and 103 ("oscillator"). The oscillator 101 includes inductors L1 and L2, a capacitor Ca, and NMOS transistors M1 and M2. It also includes a current source I1. The NMOS transistors M1 and M2 have their sources coupled to the current source I1 at the node 102 which is also coupled to one terminal of the capacitor C1.

Likewise, the oscillator 103 includes inductors L3 and L4, a capacitor Cb, and NMOS transistors M3 and M4. The oscillator 103 also includes a current source I2. The NMOS transistors M3 and M4 have their sources coupled to the current source I2 at the node 104 which is also coupled to one terminal of the capacitor C2. The current sources I1 and I2 supply bias currents for the oscillators 101 and 103. In the quadrature oscillator 100 shown in FIG. 1, the voltage signals Vx and Vy at nodes 102 and 104, respectively, have second-order harmonics (twice the frequency) of the oscillation frequency, e.g., of quadrature voltage signals V1, V2, V3, and V4.

The capacitors C1 and C2 couple the oscillators 101 and 103 at the second-order harmonic nodes 102 and 104. Since the center node Vg where both capacitors C1 and C2 are connected together is a differential virtual ground, the operation of the quadrature oscillator 100 operates normally when the two second-order harmonic signals Vx and Vy are 180° out of phase. Because of the phase delay of 90° by C1 from the virtual ground Vg, and another phase delay of 90° by C2 from the virtual ground Vg, the phase difference between nodes 102 and 104 is kept at 180°. Due to the phase difference between nodes 102 and 104, in-phase voltage signals V1 (0°) and V2 (180°) and quadrature voltage signals V3 (90°) and V4 (270°) differ in phase by 90°.

Figure 2:
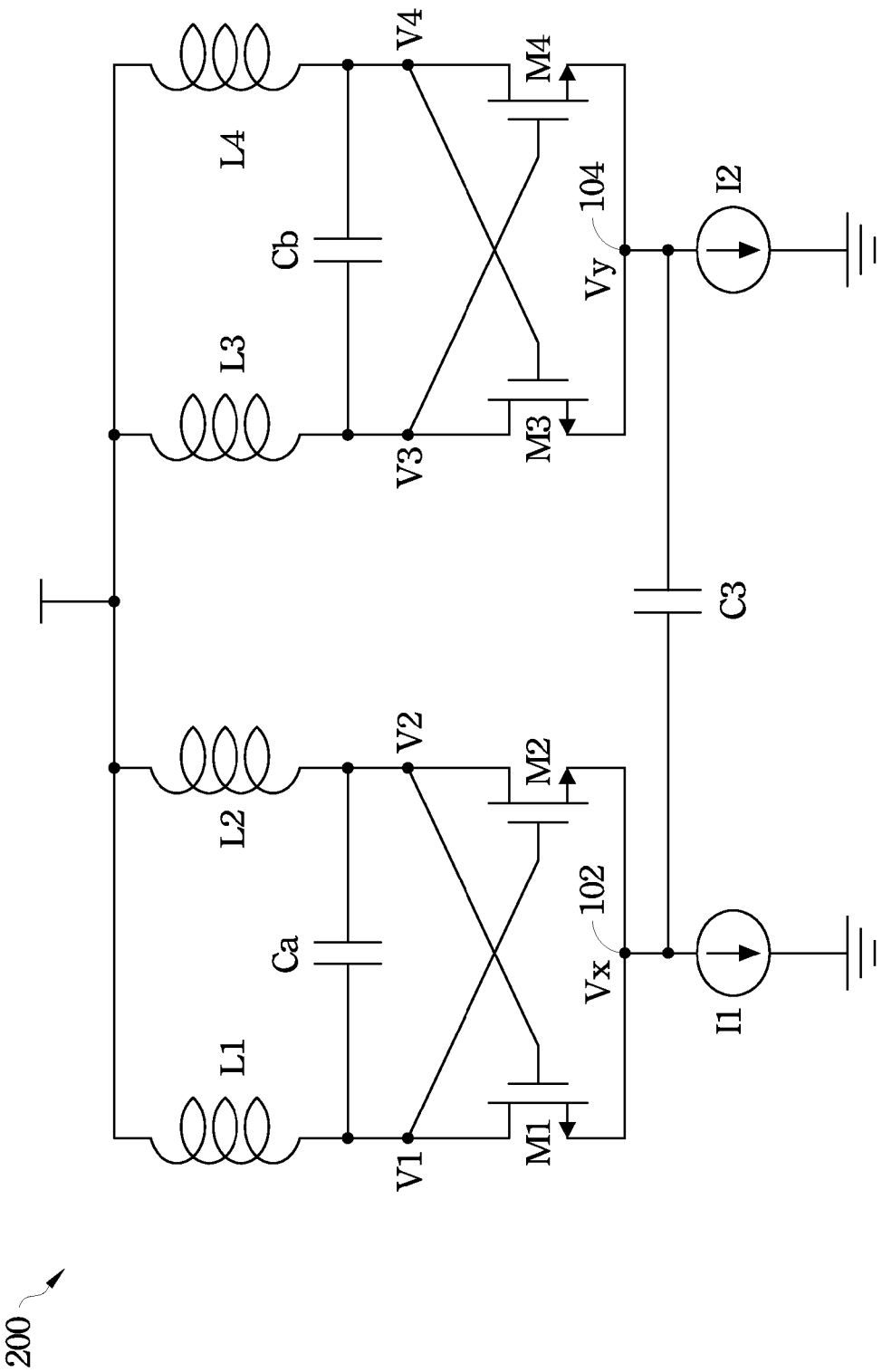
FIG. 2 is a schematic diagram showing an exemplary quadrature oscillator according to another embodiment.

In some embodiments, the total capacitance of the coupling capacitors, e.g., C1 and C2, is at least three times the parasitic capacitance at the node 102 or 104 to provide sufficient coupling function. In other embodiments, the total capacitance of the coupling capacitors, e.g., C1 and C2, is at least ten times the parasitic capacitance at the node 102 or 104. Even though two capacitors C1 and C2 are shown in FIG. 1 for an exemplary illustration, it should be noted that the number of capacitors can be any number, e.g., 1, 2, 3, . . . , etc. For example, FIG. 2 is a schematic diagram showing an exemplary quadrature oscillator 200 according to another embodiment using only one capacitor C3. Using the capacitors C1 and C2 (or C3) as coupling circuits (whether one or two capacitors, it could be equivalent to two capacitors), super-harmonic coupling and quadrature phase generation are achieved.

Figure 3:
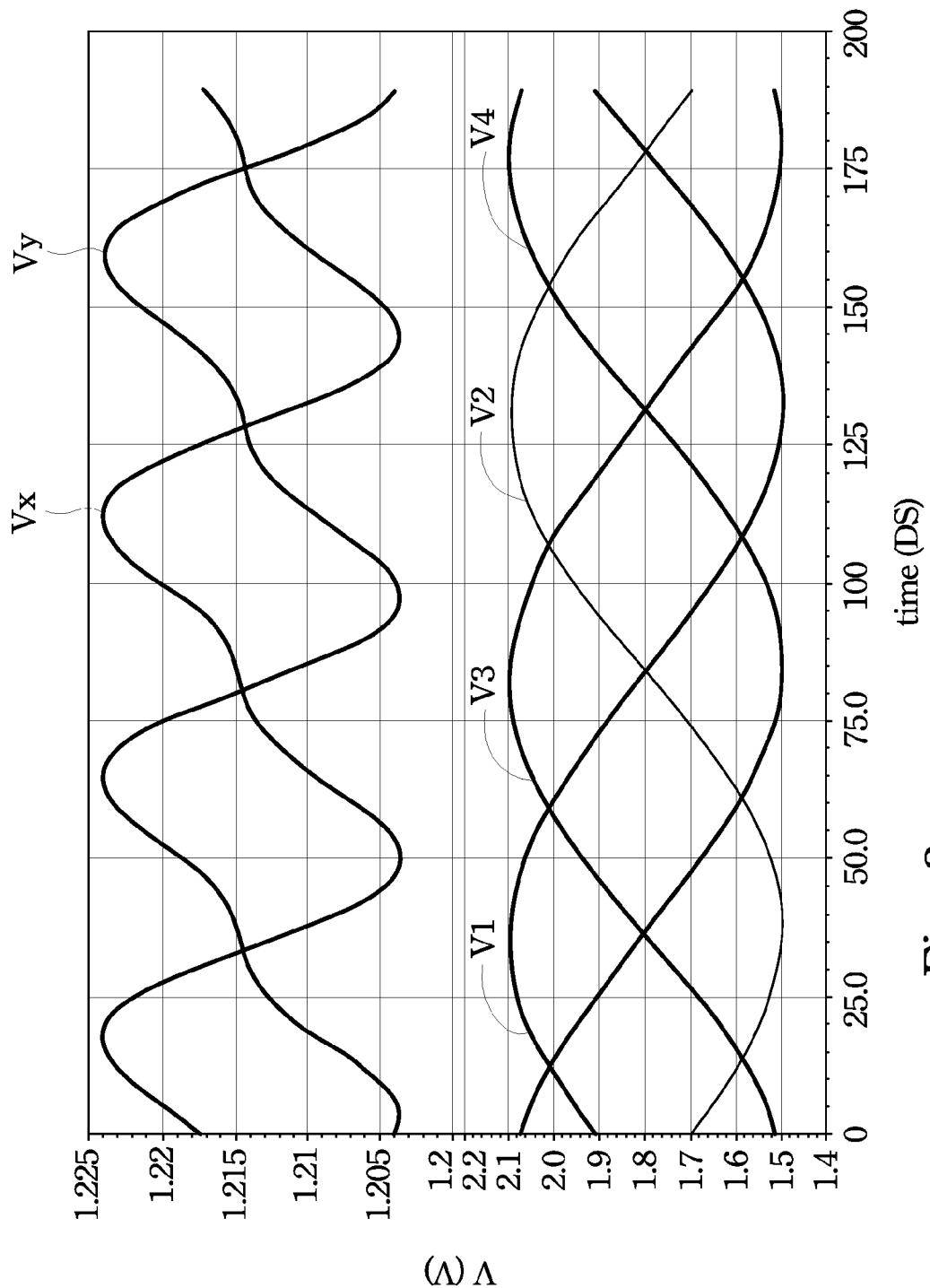
FIG. 3 is a plot showing waveforms of the quadrature oscillator in FIG. 1 and FIG. 2 according to exemplary embodiments.

FIG. 3 is a plot showing waveforms of the quadrature oscillator in FIG. 1 and FIG. 2 according to exemplary embodiments. The second-order harmonic voltage signals Vx and Vy show that they are out of phase by 180° from each other. Also, the quadrature signals V1, V2, V3, and V4 show that the in-phase signals (V1 at 0° and V2 at 180°) are out of phase by 90° from quadrature signals (V3 at 90° and V4 at 270°).

Table 1 below shows the phase noise of an exemplary quadrature oscillator 100 in FIG. 1 (or 200 in FIG. 2) compared to conventional quadrature oscillators. The phase noise comparison in Table 1 (under the same power consumption) shows that the quadrature oscillator 100 (or 200) exhibits the best phase noise performance.

TABLE 1

| Quadrature VCO | Phase Noise (dBc/Hz) |
|---|---|
| Conventional 1 | −111.9 |
| Conventional 2 | −113.7 |
| Conventional 3 | −114.8 |
| Conventional 4 | −119.5 |
| One embodiment of this invention | −119.7 |

In addition, the quadrature oscillator 100 (or 200) can have a relatively compact chip area without any phase noise degradation, extra power consumption, voltage headroom dissipation, or any LC resonant frequency effect. For example, the chip area of a coupling circuit in one conventional quadrature oscillator that uses a transformer circuit is 220*220 µm². The chip area of the coupling circuit (C1 and C2, or C3) in the exemplary quadrature oscillator 100 or 200 is 85*40 µm². The chip area saving percentage of the coupling circuit is 92%. The total chip area of another conventional quadrature oscillator is 640*472 µm²+235*235 µm². The total chip area of the exemplary quadrature oscillator 100 or 200 is only 640*472 µm². And the total chip area saving percentage is 15%.

Figure 4:
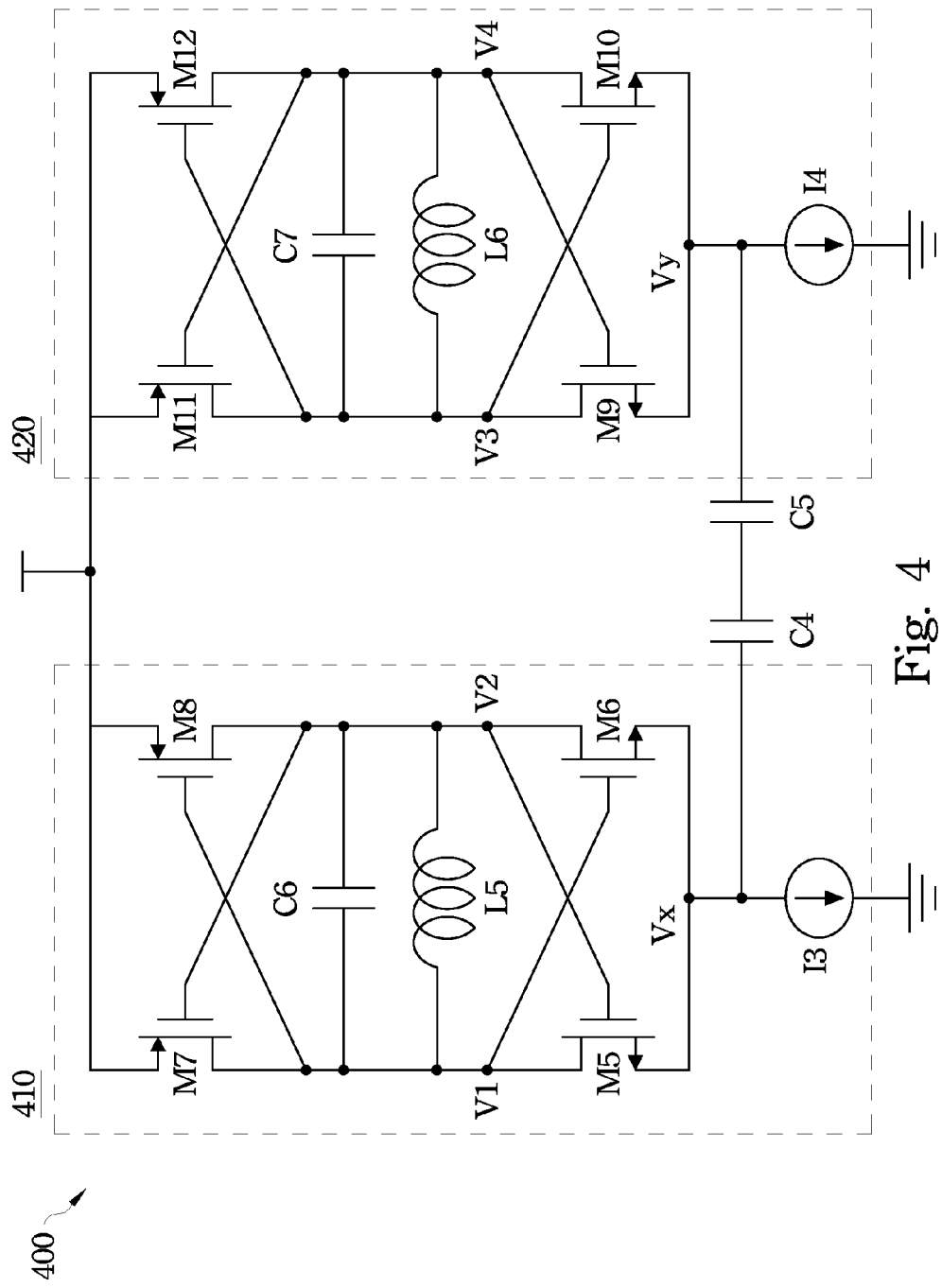
FIG. 4 is a schematic diagram showing an exemplary quadrature oscillator according to yet another embodiment.

FIG. 4 is a schematic diagram showing an exemplary quadrature oscillator 400 according to yet another embodiment. The quadrature oscillator 400 comprises two complementary cross-coupled oscillators 410 and 420 coupled by capacitors C4 and C5, with current sources I3 and I4 at the bottom. NMOS transistors M5, M6, M9, and M10 are coupled to the current sources I3 and/or I4, and coupling capacitors C4 and/or C5, similar to FIG. 1 or FIG. 2. In addition, PMOS transistors M7 and M8 have their drains coupled to the drains of the NMOS transistors M5 and M6, respectively Likewise, PMOS transistors M11 and M12 have their drains coupled to the drains of the NMOS transistors M9 and M10, respectively.

Figure 5:
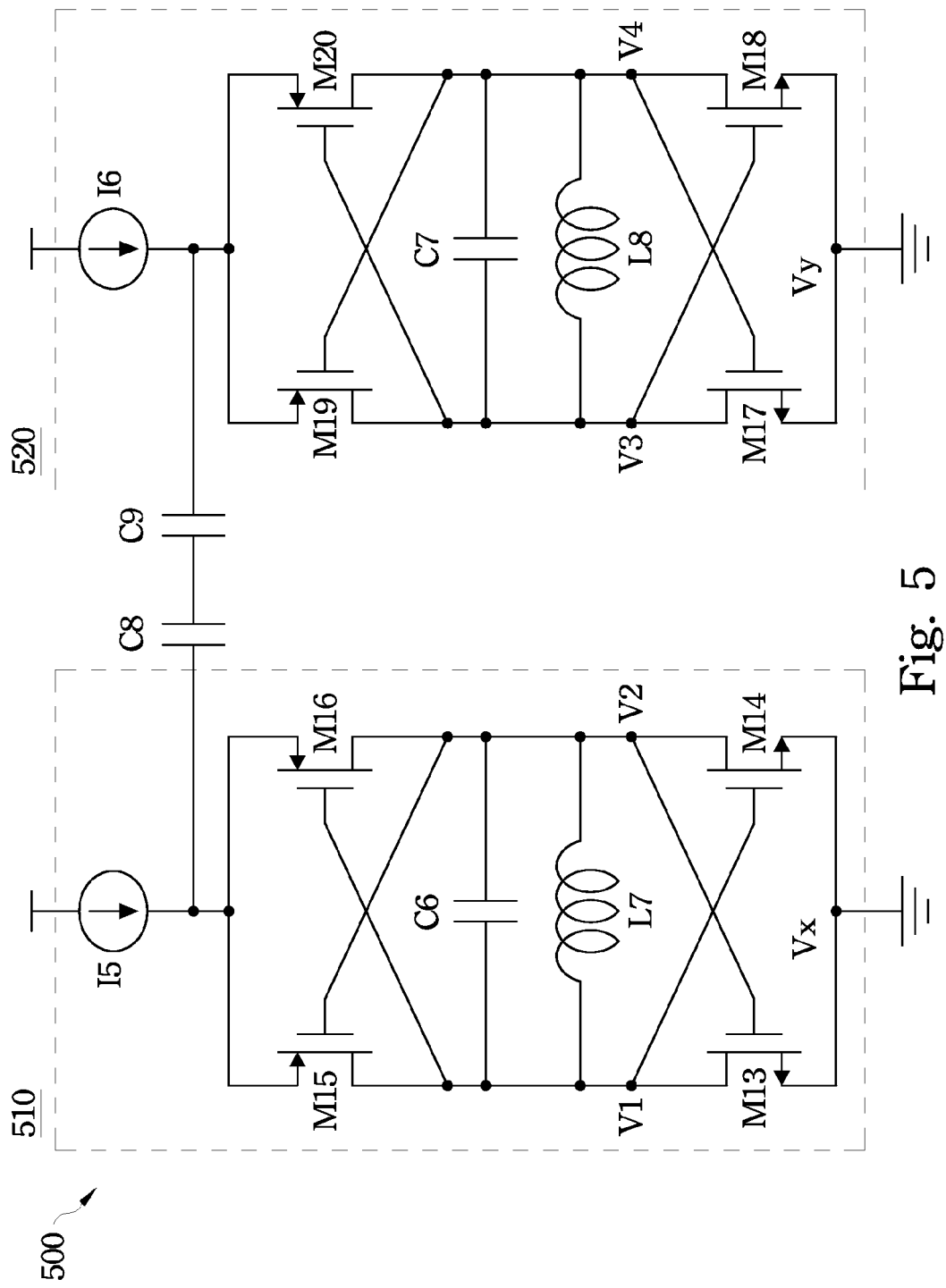
FIG. 5 is a schematic diagram showing an exemplary quadrature oscillator according to yet another embodiment.

FIG. 5 is a schematic diagram showing an exemplary quadrature oscillator 500 according to yet another embodiment. The quadrature oscillator 500 comprises two complementary cross-coupled oscillators 510 and 520 coupled by capacitors C8 and C9, with current sources I5 and I6 at the top. PMOS transistor M15 and M16 have their sources coupled to the current source I5, which is also coupled to one terminal of the capacitor C8. NMOS transistors M13 and M14 have their drains coupled to the drains of the PMOS transistors M15 and M16, respectively. Likewise, PMOS transistor M19 and M20 have their sources coupled to the current source I6, which is also coupled to one terminal of the capacitor C9. NMOS transistors M17 and M18 have their drains coupled to the drains of the PMOS transistors M19 and M20, respectively.

Figure 6:
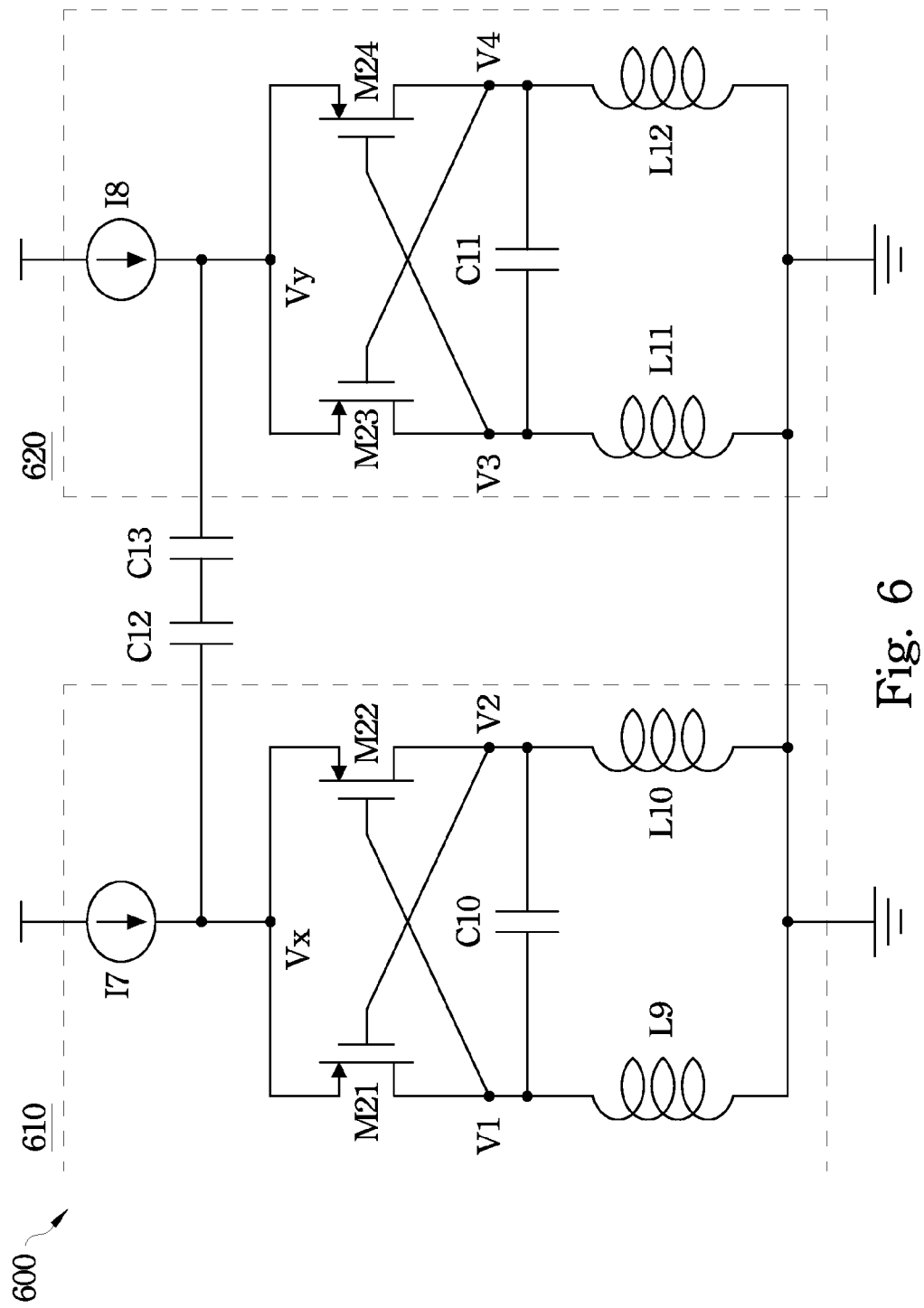
FIG. 6 is a schematic diagram showing an exemplary quadrature oscillator according to yet another embodiment.

FIG. 6 is a schematic diagram showing an exemplary quadrature oscillator 600 according to yet another embodiment. For the quadrature oscillator 600, two PMOS cross-coupled VCOS 610 and 620 with current sources I7 and I8 at the top, are coupled using capacitors C12 and C13 to generate quadrature signals V1, V2, V3, and V4. The quadrature oscillator 600 utilizes PMOS transistors M21, M22, M23, and M24 instead of NMOS transistors M1, M2, M3, and M4 of the quadrature oscillator 100 in FIG. 1. The PMOS transistor M21 and M22 have their sources coupled to the current source I7, which is also coupled to one terminal of the capacitor C12. Likewise, the PMOS transistor M23 and M24 have their sources coupled to the current source I8, which is also coupled to one terminal of the capacitor C13.

Figure 7:
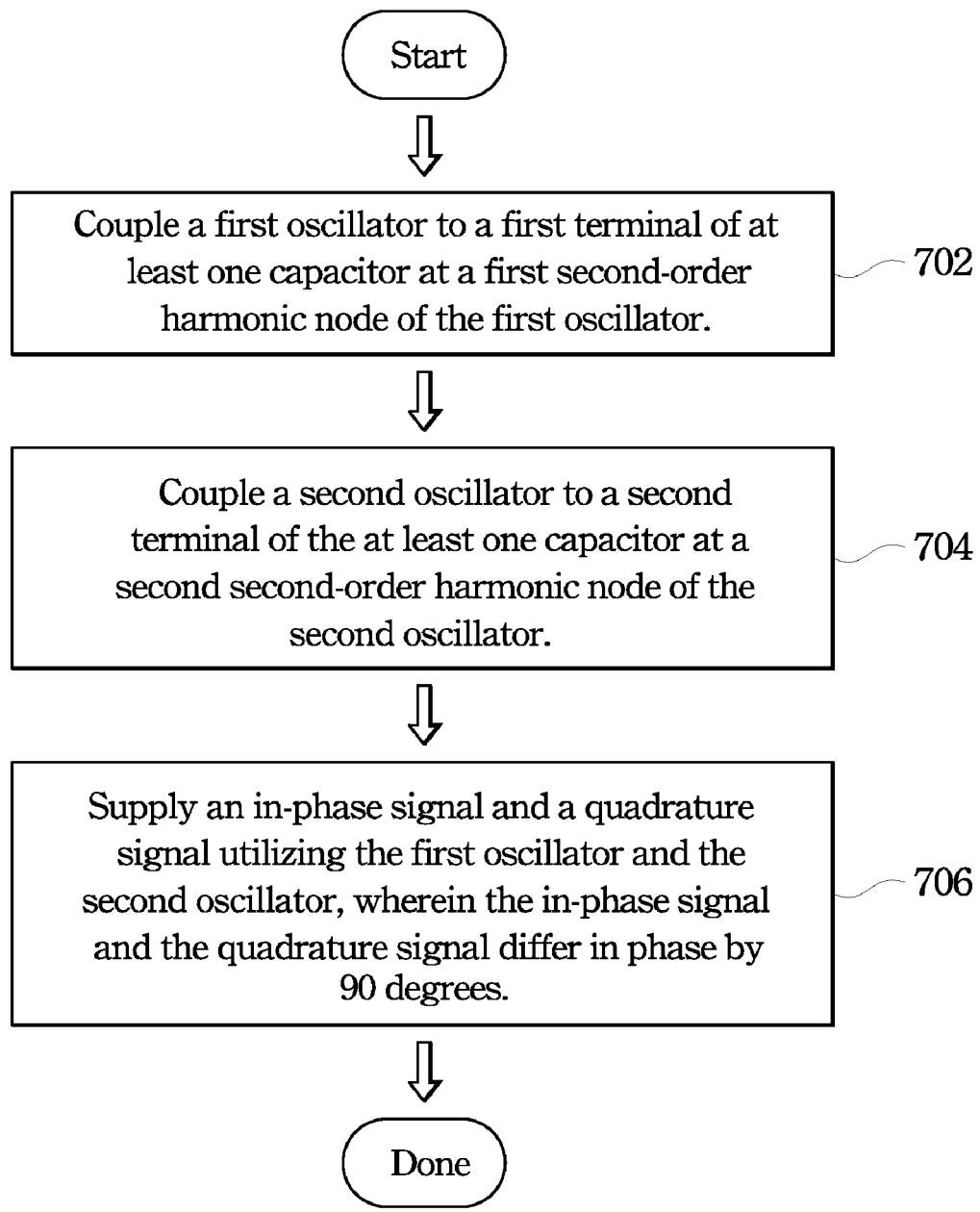
FIG. 7 is a flowchart for a method for generating quadrature signals according to some embodiments.

FIG. 7 is a flowchart for a method of generating quadrature signals according to some embodiments. At step 702, a first oscillator, e.g., 101, is coupled to a first terminal of at least one capacitor, e.g., C1 and C2, or C3, at a first second-order harmonic node, e.g., 102, of the first oscillator, e.g., 101. At step 704, a second oscillator, e.g., 103, is coupled to a second terminal of the at least one capacitor, e.g., C1 and C2, or C3, at a second second-order harmonic node, e.g., 104, of the second oscillator; e.g., 103. At step 706, an in-phase signal, e.g., V1, and a quadrature signal, e.g., V3, are supplied utilizing the first oscillator, e.g., 101, and the second oscillator, e.g., 103, wherein the in-phase signal, e.g., V1, and the quadrature signal, e.g., V3, differ in phase by 90°.

The first second-order harmonic node, e.g., 102, and the second second-order harmonic node, e.g., 104, differ in phase by 180°. In some embodiments, the at least one capacitor, e.g., C1 and C2, or C3, has a total capacitance of at least three times of a parasitic capacitance of the first second-order harmonic node, e.g., 102, or the second second-order harmonic node, e.g., 104. In some embodiments, the first oscillator, e.g., 101, and the second oscillator, e.g., 103, are differential voltage controlled oscillators (VCOS).

According to some embodiments, a quadrature oscillator includes a first oscillator having a first second-order harmonic node, a second oscillator having a second second-order harmonic node, and at least one capacitor coupling the first second-order harmonic node and the second second-order harmonic node. The first oscillator is configured to supply an in-phase signal and the second oscillator is configured to supply a quadrature signal.

According to some embodiments, a method of generating quadrature signals includes coupling a first oscillator to a first terminal of at least one capacitor at a first second-order harmonic node of the first oscillator. A second oscillator is coupled to a second terminal of the at least one capacitor at a second second-order harmonic node of the second oscillator. An in-phase signal and a quadrature signal are supplied utilizing the first oscillator and the second oscillator, wherein the in-phase signal and the quadrature signal differ in phase by 90 degrees.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiments of the disclosure. Embodiments that combine different claims and/or different embodiments are within scope of the disclosure and will be apparent to those skilled in the art after reviewing this disclosure.

What is claimed is:

1. A quadrature oscillator, comprising:
a first oscillator having a first second-order harmonic node;
a second oscillator having a second second-order harmonic node; and
at least two capacitors serially coupling the first second-order harmonic node and the second second-order harmonic node,
wherein the first oscillator is configured to supply an in-phase signal and the second oscillator is configured to supply a quadrature signal, and
wherein the at least two capacitors are configured to define a virtual ground at a center node between the at least two capacitors.

2. The quadrature oscillator of claim 1, wherein the first second-order harmonic node and the second second-order harmonic node differ in phase by 180 degrees.

3. The quadrature oscillator of claim 1, wherein the at least one capacitor has a total capacitance of at least three times of a parasitic capacitance of the first second-order harmonic node or the second second-order harmonic node.

4. The quadrature oscillator of claim 1, wherein the first oscillator and the second oscillator are differential voltage controlled oscillators.

5. The quadrature oscillator of claim 1, wherein the first oscillator comprises:
a first NMOS transistor having a first source coupled to a first current source; and
a second NMOS transistor having a second source coupled to the first current source,
wherein the first source and the second source are also coupled to a first terminal of the at least one capacitor.

6. The quadrature oscillator of claim 5, wherein the first oscillator further comprises:
a first PMOS transistor having a first drain coupled to a second drain of the first NMOS transistor; and
a second PMOS transistor having a third drain coupled to a fourth drain of the second NMOS transistor.

7. The quadrature oscillator of claim 5, wherein the second oscillator comprises:
a third NMOS transistor having a third source coupled to a second current source; and
a fourth NMOS transistor having a fourth source coupled to the second current source,
wherein the third source and the fourth source are also coupled to a second terminal of the at least one capacitor.

8. The quadrature oscillator of claim 7, wherein the second oscillator further comprises:
a first PMOS transistor having a first drain coupled to a second drain of the third NMOS transistor; and
a second PMOS transistor having a third drain coupled to a fourth drain of the fourth NMOS transistor.

9. The quadrature oscillator of claim 1, wherein the first oscillator comprises:
a first PMOS transistor having a first source coupled to a first current source; and
a second PMOS transistor having a second source coupled to the first current source,
wherein the first source and the second source are also coupled to a first terminal of the at least one capacitor.

10. The quadrature oscillator of claim 9, wherein the first oscillator further comprises:
a first NMOS transistor having a first drain coupled to a second drain of the first PMOS transistor; and
a second NMOS transistor having a third drain coupled to a fourth drain of the second PMOS transistor.

11. The quadrature oscillator of claim 9, wherein the second oscillator comprises:
a third PMOS transistor having a third source coupled to a second current source; and
a fourth PMOS transistor having a fourth source coupled to the second current source,
wherein the third source and the fourth source are also coupled to a second terminal of the at least one capacitor.

12. The quadrature oscillator of claim 11, wherein the second oscillator further comprises:
a first NMOS transistor having a first drain coupled to a second drain of the third PMOS transistor; and
a second NMOS transistor having a third drain coupled to a fourth drain of the fourth PMOS transistor.

13. A method for generating quadrature signals, comprising:
coupling a first oscillator to a first terminal of at least one capacitor at a first second-order harmonic node of the first oscillator;
coupling a second oscillator to a second terminal of the at least one capacitor at a second second-order harmonic node of the second oscillator; and
supplying an in-phase signal and a quadrature signal utilizing the first oscillator and the second oscillator, wherein the in-phase signal and the quadrature signal differ in phase by 90 degrees, and wherein the first second-order harmonic node and the second second-order harmonic node differ in phase by 180 degrees.

14. The method of claim 13, wherein the at least one capacitor has a total capacitance of at least three times of a parasitic capacitance of the first second-order harmonic node or the second second-order harmonic node.

15. The method of claim 13, wherein the first oscillator and the second oscillator are differential voltage controlled oscillators.

16. An integrated circuit having a quadrature oscillator, the quadrature oscillator comprising:
a first oscillator having a first second-order harmonic node;
a second oscillator having a second second-order harmonic node; and
at least one capacitor coupling the first second-order harmonic node and the second second-order harmonic node,
wherein the at least one capacitor has a total capacitance of at least three times of a parasitic capacitance of the first second-order harmonic node or the second second-order harmonic node.

17. The integrated circuit of claim 16, wherein the first oscillator and the second oscillator are differential voltage controlled oscillators.

18. The integrated circuit of claim 16, wherein the first oscillator comprises a first NMOS transistor having a first source coupled to a first current source, a second NMOS transistor having a second source coupled to the first current source, and the first source and the second source are coupled to a first terminal of the at least one capacitor.

19. The integrated circuit of claim 18, wherein the second oscillator comprises a third NMOS transistor having a third source coupled to a second current source, a fourth NMOS transistor having a fourth source coupled to the second current source, and the third source and the fourth source are coupled to a second terminal of the at least one capacitor.

20. The integrated circuit of claim 16, wherein the first second-order harmonic node and the second second-order harmonic node differ in phase by 180 degrees.

21. The quadrature oscillator of claim 1, wherein the at least two capacitors include a first capacitor coupled between the center node and the first second-order harmonic node and configured to create a phase difference of 90 degrees between the center node and the first second-order harmonic node; and a second capacitor coupled between the center node and the second second-order harmonic node and configured to create a further phase difference of 90 degrees between the center node and the second second-order harmonic node.

* * * * *